US006160441A

United States Patent [19]
Stratakos et al.

[11] Patent Number: 6,160,441
[45] Date of Patent: Dec. 12, 2000

[54] SENSORS FOR MEASURING CURRENT PASSING THROUGH A LOAD

[75] Inventors: Anthony Stratakos, Fremont; Andrew J. Burstein, Mountain View; David B. Lidsky, Oakland; Phong Nguyen, Pleasanton; William Clark, Fremont, all of Calif.

[73] Assignee: Volterra Semiconductor Corporation, Fremont, Calif.

[21] Appl. No.: 09/183,417

[22] Filed: Oct. 30, 1998

[51] Int. Cl.$^7$ ................................................. G05F 1/10
[52] U.S. Cl. ........................... 327/540; 327/538; 327/541; 327/52; 330/273
[58] Field of Search ........................... 327/538, 540, 327/541, 50, 51, 52, 54; 330/252, 273

[56] References Cited

U.S. PATENT DOCUMENTS

| | | | |
|---|---|---|---|
| 3,383,584 | 5/1968 | Atherton | 323/288 |
| 3,978,393 | 8/1976 | Wisner et al. | 323/283 |
| 4,034,232 | 7/1977 | La Venture | 323/283 |
| 4,357,572 | 11/1982 | Andersen et al. | 323/286 |
| 4,546,421 | 10/1985 | Bello et al. | 323/288 |
| 4,580,089 | 4/1986 | Grunsch et al. | 323/287 |
| 4,716,267 | 12/1987 | Reynolds | 219/113 |
| 5,422,562 | 6/1995 | Mammano et al. | 323/282 |
| 5,481,178 | 1/1996 | Wilcox et al. | 323/287 |
| 5,514,947 | 5/1996 | Berg | 323/282 |
| 5,523,676 | 6/1996 | Bach et al. | 324/103 |
| 5,552,694 | 9/1996 | Appeltans | 323/222 |
| 5,555,165 | 9/1996 | Vinciarelli | 363/21 |
| 5,568,074 | 10/1996 | Kitaguchi et al. | 327/77 |
| 5,578,916 | 11/1996 | Muterspaugh | 323/267 |

(List continued on next page.)

FOREIGN PATENT DOCUMENTS 0 547 916 A2  6/1993  European Pat. Off. .
WO 95/31033  11/1995  WIPO .

OTHER PUBLICATIONS

Lloyd Dixon, "Average Current Mode Control of Switching Power Supplies," *Unitrode Switching Regulated Power Supply Design Seminar Manual*, Unitrode Corporation, C1–1 to C1–14, 1991.

Lloyd Dixon, "Switching Power Supply Topology Review," *Unitrode Switching Regulated Power Supply Design Seminar Manual*, Unitrode Corporation, P1–1 to P1–11, 1991.

Kassakian et al., "DC/DC Converters," *Principles of Power Electronics*, Addison–Wesley Publishing Co., Sec. 2.3, 20–23, 1991.

Kassakian et al., "High–Frequency Switching dc/dc Converters," *Principles of Power Electronics*, Addison–Wesley Publishing Co., Chapter 6, 103–137, 1991.

Kassakian et al., "Dynamics and Control: An Overview," *Principles of Power Electronics*, Addison–Wesley Publishing Co., Chapter 11, 253–298, 1991.

(List continued on next page.)

*Primary Examiner*—Terry D. Cunningham
*Assistant Examiner*—An T. Luu
*Attorney, Agent, or Firm*—Fish & Richardson P.C.

[57] ABSTRACT

A sensor for measuring a current passing through a load. The sensor has a power transistor having a first terminal connected to substantially constant voltage and a second terminal connected to the load. The sensor can sample a voltage difference with a variable capacitor, and a controller can be configured to cause a variable capacitor in the current sensor to have a capacitance inversely proportional to a resistance of the power transistor, whereby a charge stored on the variable capacitor is proportional to the current passing through the power transistor when the sampling switches are opened. A comparator can compare the current through the power transistor to a known reference current to generate a digital output signal. The sensor can include a power transistor, reference transistor and amplifier connected and configured so as to generate a signal on a reference line having a current of known proportion to the current passing through the load.

25 Claims, 5 Drawing Sheets

U.S. PATENT DOCUMENTS

| | | | |
|---|---|---|---|
| 5,585,746 | 12/1996 | Franke | 327/54 |
| 5,646,513 | 7/1997 | Riggio, Jr. | 323/285 |
| 5,675,240 | 10/1997 | Fujisawa | 323/282 |
| 5,677,619 | 10/1997 | Doluca | 323/282 |
| 5,751,140 | 5/1998 | Canter | 323/282 |
| 5,760,613 | 6/1998 | Pulvirenti et al. | 327/78 |

OTHER PUBLICATIONS

Kassakian et al., "Discrete–Time or Sampled–Data Models," *Principles of Power Electronics*, Addison–Wesley Publishing Co., Sec. 12.5, 313–315, 1991.

Kassakian et al., "Feedback Control Design," *Principles of Power Electronics*, Addison–Wesley Publishing Co., Chapter 14, 365–402, 1991.

SENSORS FOR MEASURING CURRENT PASSING THROUGH A LOAD

BACKGROUND

The present invention relates generally to methods and apparatus for measuring current, and more particularly to current measurement techniques in switching voltage regulators.

Electronic devices are often configured to measure the current passing through a load, which may range in complexity from a single circuit element to a VLSI chip. For example, a fault protection system may measure and limit the amount of current passing through a circuit element to avoid burnout. As another example, a feedback system may measure the current passing through a circuit element, and use this current measurement to control the output of the device.

In conventional current sensors, a resistor having a known resistance R is placed in series with the circuit element to be monitored. The voltage drop V across the resistor is measured, and the current I passing through the circuit element may be calculated from Ohm's Law, V=IR. Unfortunately, special techniques are needed to fabricate resistors in semiconductor devices, thereby increasing the cost of the device or requiring the resistor to be located off the chip as an external component. In addition, the resistor dissipates power, thereby reducing the efficiency of the device.

One particular device which may require a current sensor is a switching voltage regulator (or simply "switching regulator"), such as a DC to DC converter. The switching regulator includes a switch, such as a transistor, for alternately coupling and decoupling an unregulated input DC voltage source, such as a battery, to a load, such as an integrated circuit. An output filter, typically including an inductor and a capacitor, is coupled between the input voltage source and the load to filter the output of the switch and thus provide the output DC voltage. A feedback system measures the current passing through the load, and generates a control signal which controls the duty cycle of the switch in order to maintain the output voltage at a substantially uniform level.

SUMMARY

In one aspect, the invention is directed to a sensor for measuring a current passing through a load having a power transistor, a reference transistor, and an amplifier. The power transistor has a first terminal and a second terminal and includes N substantially identical transistor elements. The first terminal of the power transistor is connected to a substantially constant voltage, and the second terminal of the power transistor connected to the load. The reference transistor has a first terminal and a second terminal and includes M substantially identical transistor elements fabricated with substantially the same process and dimensions as the transistor elements of the power transistor. The first terminal of the reference transistor is connected to one of the second terminal of the power transistor or the substantially constant voltage. The second terminal of the reference transistor connected to a reference line. The amplifier has a first input, a second input, and an output. The first input of the amplifier is connected to the second terminal of the reference transistor, and the second input of the amplifier is connected to the substantially constant voltage if the first terminal of the reference transistor is connected to the second terminal of the power transistor, or the second terminal of the power transistor if the first terminal of the reference transistor is connected to the substantially constant voltage. The output of the amplifier connected so as to force a first voltage across the power transistor to be equal to a second voltage across the reference transistor in the steady state, so as to generate a signal on the reference line having a current of known proportion to the current passing through the load.

In another aspect, the invention is directed to a sensor for measuring a current passing through a load having a power transistor, a variable capacitor, a plurality of sampling switches, and a controller. The power transistor has a first terminal connected to substantially constant voltage and a second terminal connected to the load. The plurality of sampling switches connect the variable capacitor in parallel with the power transistor. The controller is configured to cause the variable capacitor to have a capacitance inversely proportional to a resistance of the power transistor, whereby a charge stored on the variable capacitor is proportional to the current passing through the power transistor when the sampling switches are opened.

In another aspect, the invention is directed to a sensor for measuring a current passing through a load having a power transistor, a first reference transistor, a first comparator, and a first current source. The power transistor has a first terminal and a second terminal, completes a circuit between the load and a substantially constant voltage, and includes N substantially identical transistor elements. The first reference transistor has a first terminal and a second terminal and includes M substantially identical transistor elements. The transistor elements of the first reference transistor are fabricated with substantially the same process and dimensions as the transistor elements of the power transistor. The first terminal of the first reference transistor is connected to the first terminal of the power transistor. The first comparator has a first input connected to the second terminal of the power transistor, a second input connected to the second terminal of the first reference transistor, and an output connected to a first reference line. The first current source generates a first known current connected to the second terminal of the first reference transistor, whereby a digital signal is output on the reference line indicative of whether the current passing through the load is greater than N/M times the first known reference current.

Advantages of the invention may include the following. The current passing through a circuit element of a device may be measured without a resistor. The current sensor may be fabricated using complimentary metal oxide semiconductor (CMOS) fabrication techniques, thereby permitting the current sensor to be fabricated on the same chip as the device and at a reduced cost. Furthermore, the current sensor of the present invention may consume less power than a conventional current sensor.

DETAILED DESCRIPTION

Figure 1:
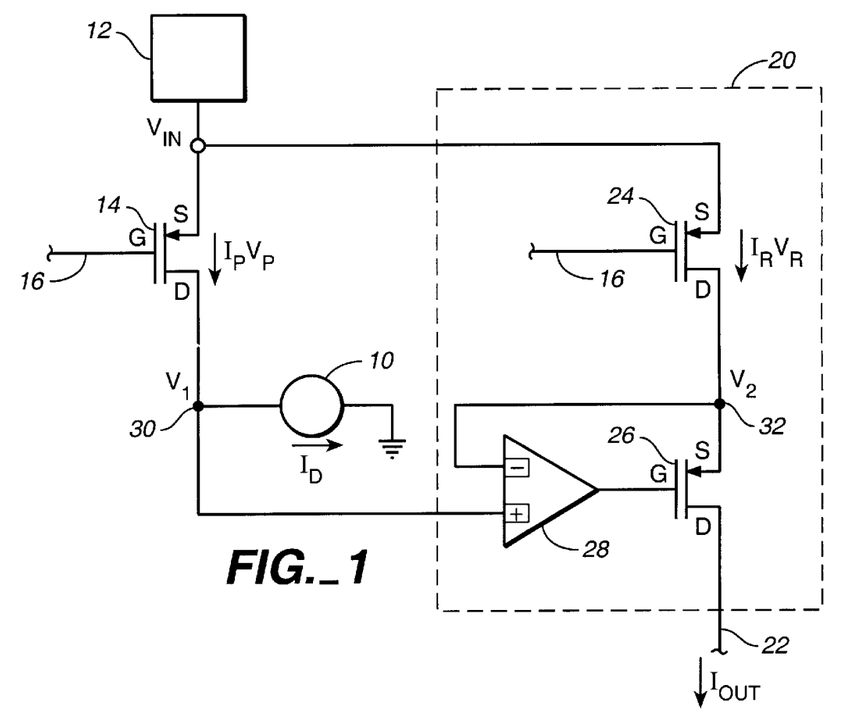
FIG. 1 is a schematic circuit diagram of a current sensor for measuring the current flowing out of the drain of a PMOS transistor in accordance with the present invention.

Referring to FIG. 1, an electronic device includes a load 10, such as an integrated circuit, connected to an input voltage source 12, such as an unregulated DC battery, by a power transistor 14. The transistor may be a metal oxide semiconductor field effect transistor (MOSFET), particularly a P-type MOS (PMOS) transistor, with a source connected to the input voltage source 12, a drain connected to the load 10, and a gate connected to a control line 16. Although illustrated as a single element, the power transistor 14 is fabricated as an array of N identical transistor elements connected in parallel. Multiple transistor elements are included in the power transistor 14 to increase the amount of current that can be supplied to the load without burning out the power transistor.

The electronic device also includes a current sensor 20 to measure the device current $I_D$ flowing through the load 10. The current sensor 20 generates an electrical signal on a reference line 22 having an output current $I_{OUT}$ which has a known proportion to the device current $I_D$ flowing through the load 10. The current sensor 20 includes a reference transistor 24, an amplifier 28, and a follower transistor 26. The reference transistor 24 has a source connected to the input voltage source 12, a drain connected to the source of the follower transistor 26, and a gate connected to the control line 16. The drain of the follower transistor 26 is connected to the reference line 22, and the gate of the follower transistor 26 is connected to the output of the amplifier 28. The positive input of the amplifier 28 is connected to a first node 30 located between the load 10 and the power transistor 14, whereas the negative input of the amplifier 28 is connected to a second node 32 located between the drain of the reference transistor 24 and the source of the follower transistor 26.

The reference transistor 24 is the same type of transistor as the power transistor, i.e., a PMOS transistor. In addition, the reference transistor 24 can be matched to the power transistor 14, i.e., the individual transistor elements in both transistors are fabricated using the same process, with the same dimensions, and on the same chip, so that they have substantially identical electrical characteristics. However, whereas the power transistor 14 has N transistor elements, the reference transistor 24 has only a single transistor element. The follower transistor 26 should also be the same type of transistor as the power transistor 14, i.e., a PMOS transistor.

In operation, assuming the control line 16 is connected to ground to close the power transistor 14, current flows from the input voltage source 12, through the power transistor 14, and into the load 10. The voltage drop $V_P$ across the power transistor 14 is $$V_P = I_P \times R_P$$

where $I_P$ is the current flowing through the power transistor and $R_P$ is the resistance of the power transistor. Similarly, the voltage drop $V_R$ across the reference transistor 24 is $$V_R = I_R \times R_R$$

where $I_R$ is the current flowing through the reference transistor and $R_R$ is the resistance of the reference transistor. Since the power transistor 14 and the reference transistor 24 are both connected to the input voltage source 12, the voltage $V_1$ at the first node 30 is given by $V_1 = V_{IN} - V_P$, and the voltage $V_2$ at the second node 32 is given by $V_2 = V_{IN} - V_R$. In the steady state, the amplifier 28 forces the voltage $V_2$ at the second node 32 to be equal to the voltage $V_1$ at the first node 30, so that $V_{IN} - V_P = V_{IN} - V_R$. Consequently, in the steady state, the voltage drop $V_P$ across the power transistor is equal to the voltage drop $V_R$ across the reference transistor, i.e., $V_P = V_R$. Thus, $$I_P \times R_P = I_R \times R_R$$

In addition, in the steady state, no current flows between the first node 30 and the second node 32. Therefore, the current $I_P$ flowing through the power transistor 14 is equal to the device current $I_D$, i.e., $I_P = I_D$, and the current $I_R$ flowing through the reference transistor 24 is equal to the output current $I_{OUT}$ on the reference line 22, i.e., $I_R = I_{OUT}$. Since the power transistor 14 includes N transistor elements connected in parallel, whereas the reference transistor 24 includes only a single transistor element, the resistance $R_P$ of the power transistor 14 will be 1/N times the resistance $R_R$ of the reference transistor 24. Consequently, $$I_D \times R_R = I_{OUT} \times N \times R_R$$

$$I_{OUT} = I_D / N$$

The signal on the reference line 22 may be used by a feedback circuit or a fault protector to control the power transistor 14 or the load 10. The reference current $I_{OUT}$ on the reference line 22 may be used directly by the feedback circuit, or the reference line 22 may be connected to a resistor, and the voltage drop across the resistor may be used by the feedback circuit. Since the current sensor 20 may be fabricated entirely with CMOS technology, it may be built at lower cost and on the same chip as the load 10. In addition, the current passing through the reference line 22 does not constitute an additional drain on the load 10.

Figure 2:
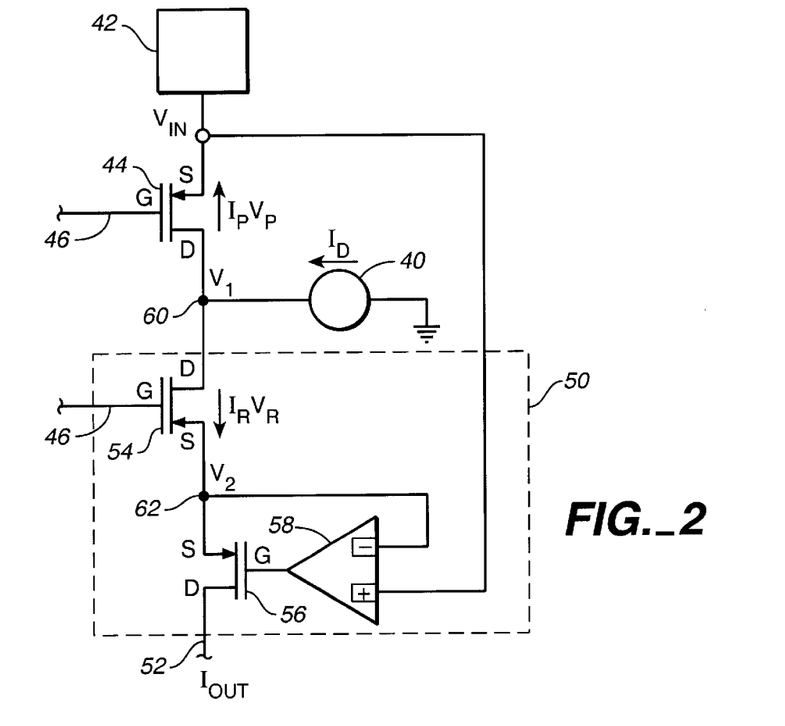
FIG. 2 is a schematic circuit diagram of a current sensor for measuring the current flowing into the drain of a PMOS transistor.

FIG. 2 illustrates a current sensor particularly suited for measuring the current flowing out of a load and into a PMOS transistor. In a device implementing this configuration, ground may be the lowest voltage on the chip. As illustrated, a load 40 is connected to an input voltage source 42 by a PMOS power transistor 44. The power transistor 44 has a source connected to the input voltage source 42, a drain connected to the load 40, and a gate connected to a control line 46. Although illustrated as a single circuit element, the power transistor 44 is fabricated as an array of N identical transistor elements connected in parallel.

The device also includes a current sensor 50 for measuring the device current $I_D$ passing through the load 40. The current sensor 50 generates a signal on a reference line 52 having an output current $I_{OUT}$ which is proportional to the device current $I_D$. The current sensor 50 includes a PMOS reference transistor 54, a PMOS follower transistor 56, and an amplifier 58. The reference transistor 54 is matched to the power transistor 44, i.e., the reference transistor may be a single transistor element fabricated using the same process, with the same dimensions, and on the same chip, as the transistor elements of the power transistor. The reference transistor 54 has a drain connected to a first node 60 located between the load 40 and the power transistor 44, a source connected to the source of the follower transistor 56, and a gate connected to the control line 56. The follower transistor 56 has a drain connected to the reference line 52, and a gate connected to the output of the amplifier 58. The positive input of the amplifier 58 is connected to the input voltage source 42, whereas the negative input of the amplifier 58 is connected to a second node 62 located between the source of the reference transistor 54 and the source of the follower transistor 56.

In operation, assuming the control line 46 is connected to ground to close the power transistor, current will flow out of the load 40, through both the power transistor 44 and the reference transistor 54, and into the input voltage source 42 and the reference line 52, respectively. The voltage drop $V_P$ across the power transistor 44 is $$V_P = I_P \times R_P$$

where $I_P$ is the current flowing through the power transistor and $R_P$ is the resistance of the power transistor. Similarly, the voltage drop $V_R$ across the reference transistor 54 is $$V_R = I_R \times R_P$$

where $I_R$ is the current flowing through the reference transistor and $R_R$ is the resistance of the reference transistor. The voltage $V_1$ at the first node 60 is the difference between the input voltage $V_{IN}$ and the voltage drop $V_P$ across the power transistor 44, i.e., $V_1 = V_{IN} - V_P$. Similarly, the voltage $V_2$ at the second node 62 is equal to the voltage $V_1$ at the first node plus the voltage drop $V_R$ across the reference transistor 54, i.e., $V_2 = V_1 + V_R$. In the steady state, the amplifier 58 forces the voltage difference between its positive and negative inputs to be zero, so that the voltage $V_2$ at the second node 62 is equal to the input voltage $V_{IN}$, i.e., $V_2 = V_{IN}$. Since $V_{IN} = V_1 + V_P$ and $V_{IN} = V_1 + V_R$, the voltage drop $V_P$ across the power transistor 44 will equal the voltage drop $V_R$ across the reference transistor 54, i.e., $V_P = V_R$. Thus, $$I_P \times R_P = I_R \times R_R$$

Since current flows out of the load 40 and into both the power transistor 44 and the reference transistor 54, the device current $I_D$ is equal to the current $I_R$ flowing through the reference transistor 54 plus the current $I_P$ flowing through the power transistor 44, i.e., $I_D = I_R + I_P$. In addition, since no other current is flowing into reference line 52, the output current $I_{OUT}$ is equal to the current $I_R$ flowing through the reference transistor 54, i.e., $I_R = I_{OUT}$. Assuming that the reference transistor 54 is fabricated with a single transistor element, whereas the power transistor 44 is fabricated with N transistor elements, the resistance $R_R$ of the reference transistor 54 will be N times the resistance $R_P$ of the power transistor 44. Consequently, $$(I_D - I_R) \times R_R = I_R \times N \times R_R$$

$$I_D \times R_R = I_R \times (N+1) \times R_R$$

$$I_{OUT} = I_D / (N+1)$$

Figure 3:
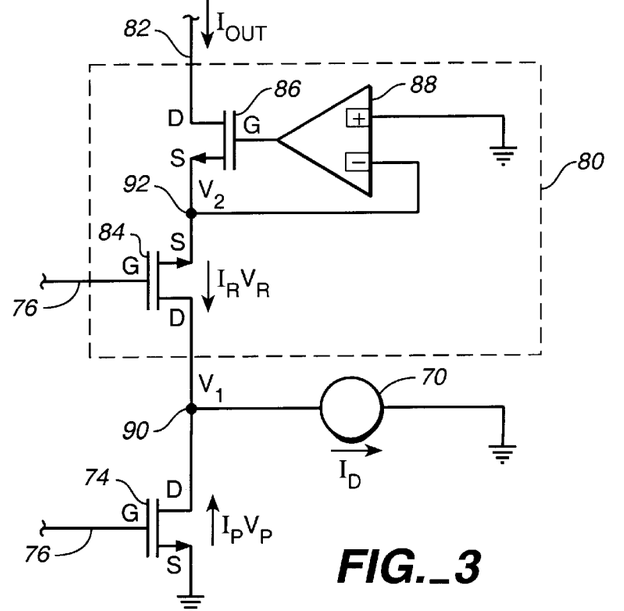
FIG. 3 is a schematic circuit diagram of a current sensor for measuring the current flowing out of the drain of an NMOS transistor.

FIG. 3 shows a current sensor particularly suited for measuring the current passing through an N-type (NMOS) transistor. As illustrated, an electronic device includes a load 70 that is connected to ground by an NMOS power transistor 74. The power transistor 74 has a source connected to ground, a drain connected to the load 70, and a gate connected to a control line 76. Although illustrated as a single circuit element, the power transistor 74 is fabricated as an array of N identical transistor elements connected in parallel.

The device also includes a current sensor 80 to measure the device current $I_D$ flowing through the load 70. The current sensor 80 generates an output signal on a reference line 82 having an output current $I_{OUT}$ which is proportional to the device current $I_D$. The current sensor 80 includes an NMOS reference transistor 84, an NMOS follower transistor 86, and an amplifier 88. The reference transistor 84 is matched to the power transistor 74, i.e., the reference transistor is constructed of a single transistor element that is fabricated using the same process, with the same dimensions, and on the same chip, as the transistor elements of the power transistor. The reference transistor 84 has a drain connected to a first node 90 located between the power transistor 74 and the load 70, a source connected to the source of the follower transistor 86, and a gate connected to the control line 76. The gate of the follower transistor 86 is connected to the output of the amplifier 88, and the drain of the follower transistor 86 is connected to the reference line 82. The positive input of the amplifier 88 is connected to ground, whereas the negative input of the amplifier 88 is connected to a second node 92 located between the reference transistor 84 and the follower transistor 86.

In operation, assuming that the power transistor and reference transistor are closed, current flows from the reference line and from ground, through the reference and power transistors, and into the load 70. The voltage drop $V_P$ across the power transistor 74 is $$V_P = I_P \times R_P$$

where $I_P$ is the current flowing through the power transistor and $R_P$ is the resistance of the power transistor. Similarly, the voltage drop $V_R$ across the reference transistor 84 is $$V_R = I_R \times R_P$$

where $I_R$ is the current flowing through the reference transistor and $R_R$ is the resistance of the reference transistor. Since the power transistor 74 is connected to ground, the voltage $V_1$ at the first node 90 is equal to the voltage drop $V_P$ across the power transistor 74, i.e., $V_1 = V_P$ Because the reference transistor 84 is connected between the first and second nodes, the voltage drop $V_R$ across the reference transistor is equal to the difference between the voltage $V_2$ at the second node 92 and the voltage $V_1$ at the first node 90, i.e., $V_1 - V_2 = V_R$. In steady state the amplifier forces the positive and negative input to be the same, so that the voltage $V_2$ at the second node 92 is driven to ground, i.e., $V_2 = 0$. Consequently, the voltage $V_1$ at the first node will be equal to the voltage drop $V_R$ across the reference transistor 84, i.e., $V_1 = V_R = V_P$. Thus, $$I_P \times R_P = I_R \times R_R$$

In the steady state, the current $I_R$ flowing through the reference transistor 84 is equal to the output current $I_{OUT}$, i.e., $I_R = I_{OUT}$, whereas the device current $I_D$ flowing through the load 70 is the sum of the current $I_P$ flowing through the power transistor 74 and the current $I_R$ flowing through the reference transistor 84, i.e., $I_D = I_P + I_R$. Assuming that the reference transistor 84 is fabricated with a single transistor element, whereas the power transistor 74 is fabricated with N transistor elements, the resistance $R_R$ of the reference transistor 84 will be N times the resistance $R_P$ of the power transistor 74. Consequently, $$(I_D - I_R) \times R_R = I_R \times N \times R_R$$

$$I_D \times R_R = I_R \times (N+1) \times R_R$$

$$I_{OUT} = I_D / (N+1)$$

Figure 4:
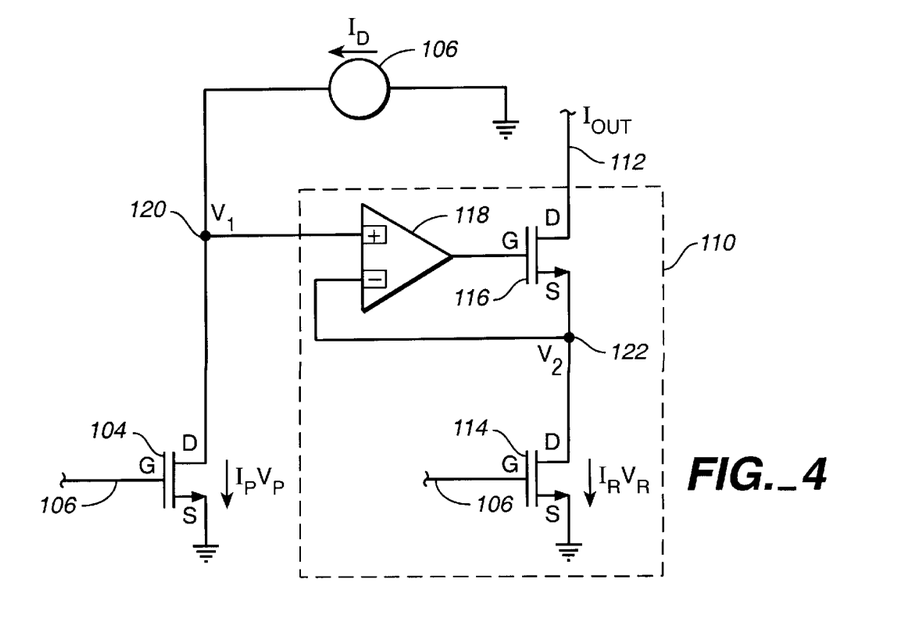
FIG. 4 is a schematic circuit diagram of a current sensor for measuring the current flowing into the drain of an NMOS transistor.

FIG. 4 illustrates a current sensor particularly suited for measuring the current flowing out of a load and through an NMOS power transistor. As illustrated, a load 100 is connected to ground by an NMOS power transistor 104. Specifically, the power transistor 104 has a source connected to ground, a drain connected to the load 100, and a gate connected to a control line 106. Although illustrated as a single circuit element, the power transistor 104 is fabricated as an array of N identical transistor elements connected in parallel.

A current sensor 110 generates a signal on a reference line 112 having an output current $I_{OUT}$ which is proportional to the device current $I_D$ flowing through the load 100. The current sensor 110 includes an NMOS reference transistor 114, an NMOS follower transistor 116, and an amplifier 118. The reference transistor 114 is matched to the power transistor 104, i.e., the reference transistor is constructed of a single transistor element that is fabricated using the same process, with the same dimensions, and on the same chip, as the transistor elements of the power transistor. The reference transistor 114 has a source connected to ground, a drain connected to the source of the follower transistor 116, and a gate connected to the control line 106. The follower transistor 116 has a drain connected to the reference line 112 and a gate connected to the output of the amplifier 118. The positive input of the amplifier 118 is connected to a first node 120 between the load 100 and the power transistor 104, whereas the negative input of the amplifier 118 is connected to a second node 122 between the drain of the reference transistor 114 and the source of the follower transistor 116.

In operation, assuming that the power transistor 104 and reference transistor 114 are closed, current will flow out of the load 100, through the power transistor 104 and to ground. The voltage drop $V_P$ across the power transistor 104 is $$V_P = I_P \times R_P$$

where $I_P$ is the current flowing through the power transistor and $R_P$ is the resistance of the power transistor. Similarly, the voltage drop $V_R$ across the reference transistor 114 is $$V_R = I_R \times R_P$$

where $I_R$ is the current flowing through the reference transistor and $R_R$ is the resistance of the reference transistor. Since the power and reference transistors are both connected to ground, the voltage $V_1$ is equal to the voltage drop $V_P$ across the power transistor 104, i.e., $V_1 = V_P$, and the voltage $V_2$ is equal to the voltage drop $V_R$ over the reference transistor 114, i.e., $V_2 = V_R$. In the steady state, the amplifier 118 will force the voltage difference between its positive and the negative inputs to zero. Consequently, the voltage $V_1$ at the first node 120 will be equal to the voltage $V_2$ at the second node 122, i.e., $V_1 = V_2$. Therefore, the voltage drop across the power transistor 104 is equal to the voltage drop across the reference transistor 114, i.e., $V_P = V_R$. Thus, $$I_P \times R_P = I_R \times R_R$$

In addition, because no current flows between the first node 120 and the second node 122, the current $I_P$ flowing through the power transistor 104 is equal to the device current $I_D$ flowing through the load 100, i.e., $I_P = I_D$, and the current $I_R$ flowing through the reference transistor 114 is equal to the output current $I_{OUT}$ on the reference line 112, i.e., $I_R = I_{OUT}$. Since the power transistor 104 is constructed of N transistor elements connected in parallel, whereas the reference transistor includes a single transistor element, the resistance $R_R$ of the reference transistor 114 is N times the resistance $R_P$ of the power transistor 104. Consequently, $$I_D \times R_R = I_{OUT} \times N \times R_R$$

$$I_{OUT} = I_D / N$$

Figure 5:
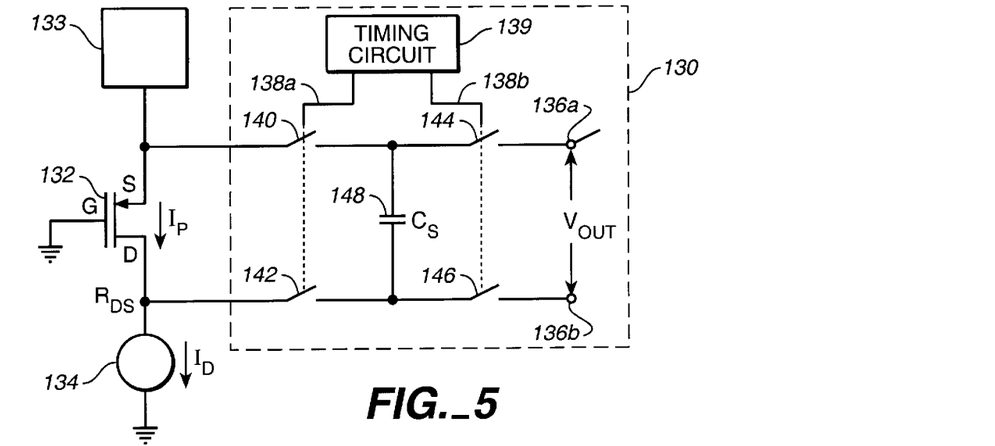
FIG. 5 is a schematic circuit diagram of a current sensor including a sampling circuit to sample the voltage across the circuit element.

Referring to FIG. 5, in another embodiment, a current sensor 130 uses a power transistor 132 as the resistive element for the measurement of the current passing through a load 134. One terminal of the power transistor 132 is connected to the load, and the other terminal of the power transistor 132 is connected to a voltage supply 133. The current sensor 130 includes four sampling switches 140, 142, 144 and 146 and a sampling capacitor 148. The top plate of the sampling capacitor 148 is connected to the source of the power transistor 132 by the first sampling switch 140. Similarly, the bottom plate of the sampling capacitor 148 is connected to the drain of the power transistor by the second sampling switch 142. The top plate of the sampling capacitor 148 is coupled to a first output terminal 136a by the third sampling switch 144, and the bottom plate of the sampling capacitor 148 is connected to a second output terminal 136b by the fourth sampling switch 146. The first and second switches 140 and 142 are controlled by a control signal $\phi_1$ on a timing line 138a, whereas the third and fourth switches 144 and 146 are controlled by a control signal $\phi_2$ on a timing line 138b. The control signals $\phi_1$ and $\phi_2$ may be generated on timing lines 138a and 138b by a timing circuit 139. In operation, the first and second switches 140 and 142 and are opened simultaneously to perform the current measurement. The third and fourth switches 144 and 146 are closed once the first and second switches 140 and 142 open to provide the voltage across the sampling capacitor 148 to the first and second output terminals 136a and 136b. The first and second switches 140 and 142 are not closed at the same time that the third and fourth switches 144 and 146 are closed, i.e., the control signals $\phi_1$ and $\phi_2$ do not overlap.

The device current $I_D$ is equal to the current $I_P$ flowing through the power transistor 132. The current $I_P$ is given by $V_{DS} = I_P \times R_{DS}$, where $V_{DS}$ is the voltage drop across the power transistor and $R_{DS}$ is the resistance of the power transistor. Thus, the voltage drop $V_{DS}$ will be proportional to the device current $I_D$. Since the sampling capacitor and the power transistor are connected in parallel, the voltage drop $V_{OUT}$ across the sampling capacitor measured at output terminals 136a and 136b will be equal to the voltage $V_{DS}$ across the power transistor. Thus, the voltage $V_{OUT}$ is proportional to the device current $I_D$ at the time the voltage sampling measurement is taken. When the first and second sampling switches 140 and 142 open, a voltage $V_{OUT}$ representing the device current $I_D$ is provided at the output terminals 136a and 136b by the sampling capacitor 148.

Figure 6:
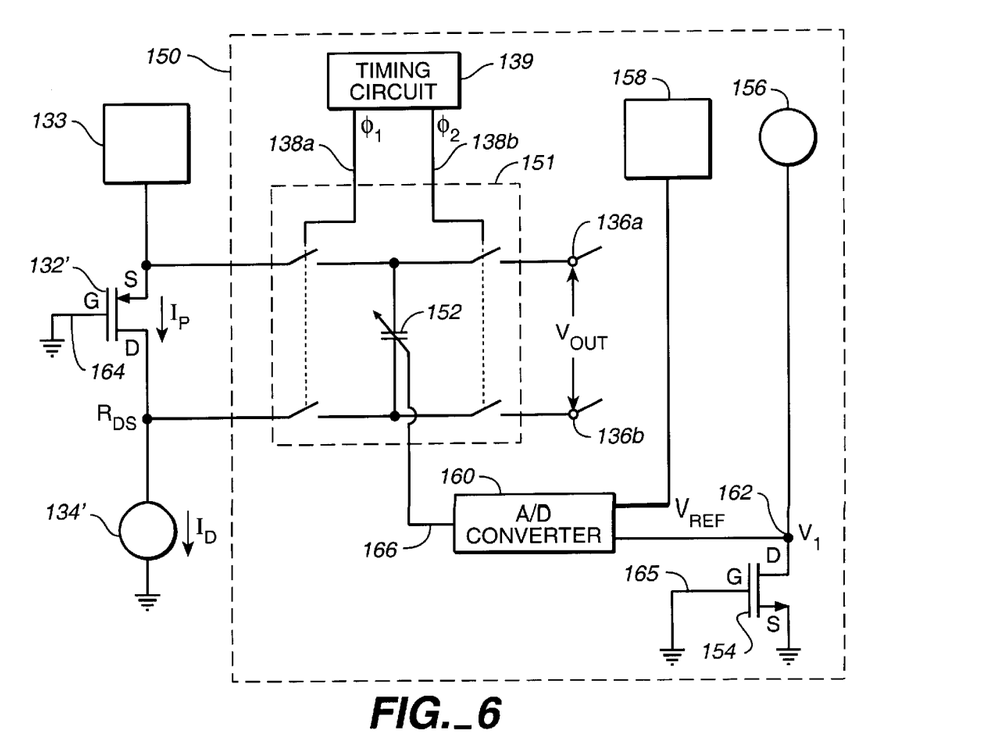
FIG. 6 illustrates a current sampler in which the sampling capacitance is calibrated for changes in the resistance of the transistor.

Unfortunately, the resistance $R_{DS}$ of the power transistor is not a well-known quantity. Specifically, the value of $R_{DS}$ varies from chip to chip due to process variations, and the value of $R_{DS}$ for a particular transistor on a specific chip may change with time due to temperature and voltage variations. Referring to FIG. 6, a current sensor 150 includes a sampling circuit 151 with a variable sampling capacitor 152. As will be described in greater detail below, the capacitance $C_S$ of the variable capacitor 152 is controlled so as to be inversely proportional to the resistance $R_{DS}$ of the power transistor 132'. Since the charge Q stored on the variable capacitor 152 is given by $Q=I_P \times R_{DS} \times C_S$, if the $R_{DS}$ and $C_S$ terms are inversely proportional, any variation in $R_{DS}$ will be cancelled by an inverse variation in $C_S$, and the charge Q will have a known proportion to the current $I_P$ passing through the power transistor 132' at the sampling time. The current sensor 150 includes a reference transistor 154, a current source 156 which generates a known current $I_{REF}$, and a voltage source 158 which generates a known voltage of $V_{REF}$. The reference transistor 154 includes a single transistor element fabricated using the same processing techniques, with the same dimensions, and on the same chip as the transistor elements of the power transistor 132'. The reference transistor 154 has a source connected to ground, a drain connected to the current source 156, and a gate connected to a second control line 165 that also controls the power transistor 132'. Since RDS changes slowly (at least in comparison to the frequency of a power transistor in a switching regulator), the reference transistor 154 is closed each time that the variable capacitor 152 is to be resized. The second control line 165 may be activated each time that the capacitance of the variable capacitor 152 is to be adjusted. Typically, the capacitance of the variable capacitor 152 will change relatively slowly compared to the switching frequency of power transistor 132'. Current sensor 150 also includes an analog to digital (A/D) converter 160 with one input connected to the voltage source 158 and another input connected to a node 162 located between the drain of the reference transistor 154 and the current source 156.

The voltage $V_1$ at the node 162 is equal to the voltage drop $V_R$ across the reference transistor 154, i.e., $V_1 = V_R = I_{REF} \times R_R$, where $R_R$ is the resistance of the reference transistor. Since the reference transistor 154 and the power transistor 132' are matched, the reference transistor resistance $R_R$ should be N times power resistor resistance $R_{DS}$. Thus, $V_1 = I_{REF} \times N \times R_{DS}$. The A/D converter 160 is configured to quantize the ratio between the voltage $V_1$ and the reference voltage $V_{REF}$. Since $I_{REF}$, $V_{REF}$ and N are constants, the output of the A/D converter 160 on a control bus 166 will be a digital signal that is proportional to the power transistor resistance $R_{DS}$. Specifically, the output of the A/D converter 160 may output an M-bit signal on output lines $A_1$, $A_2$, $A_3$, . . . , $A_M$ (see FIG. 7). The output of the A/D converter 160 controls the variable capacitor 152. Specifically, the sampling circuit 151 is configured so that the sampling capacitor capacitance $C_S$ is inversely proportional to the power transistor resistance $R_{DS}$. Consequently, the charge Q stored on the variable capacitor 152 will be directly proportional to the current by passing through the power transistor 132' at the measurement time.

Figure 7:
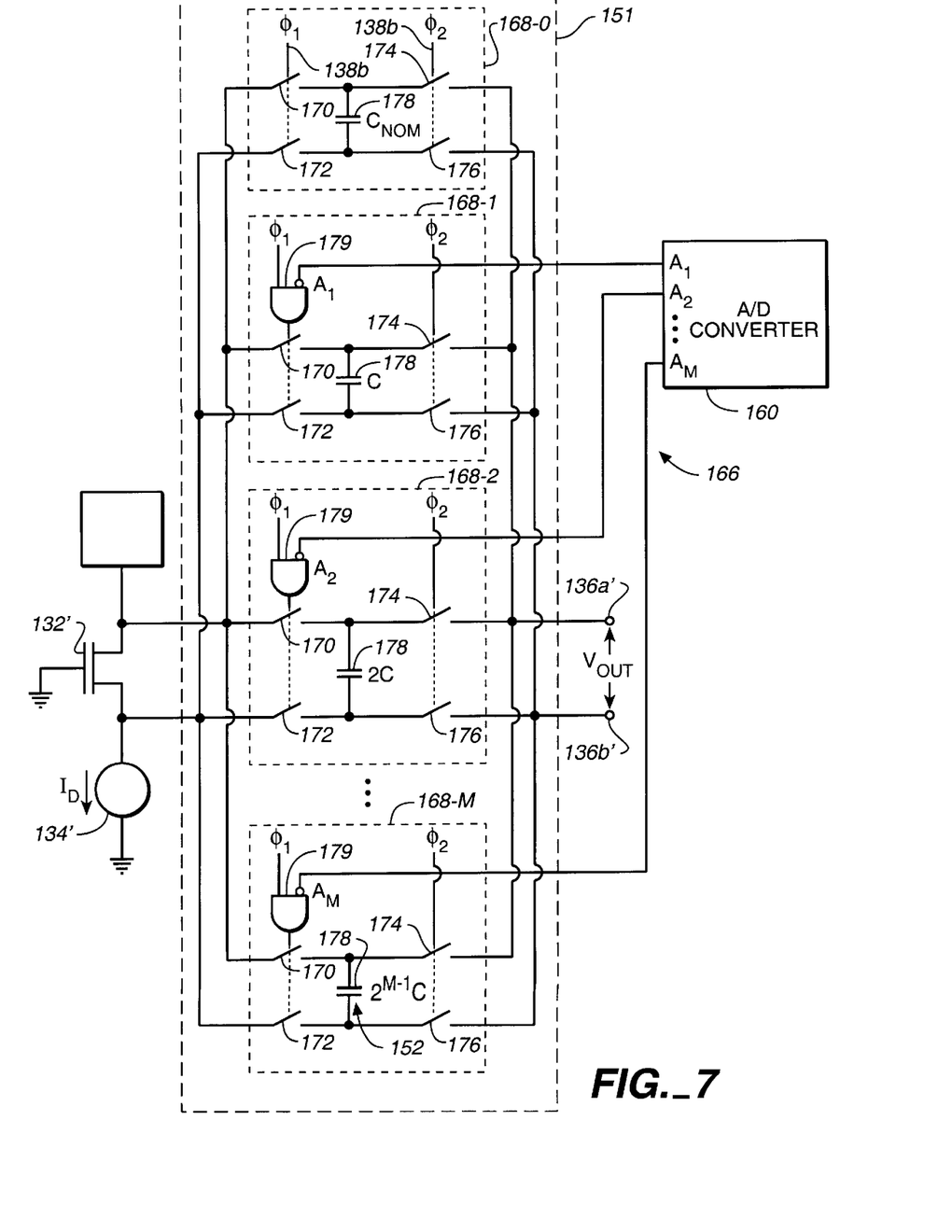
FIG. 7 is a schematic circuit diagram of a sampling capacitor having a variable capacitance.

Referring to FIG. 7, the sampling circuit 151 and variable capacitor 152 may be implemented with a binary weighted capacitor array and digital logic. For example, the sampling circuit 151 may include an array of M+1 sampling units 168-0, 168-1, . . . , 168-M. Each sampling unit 168 includes four sampling switches 170, 172, 174 and 176 and a sampling capacitor 178. The sampling capacitor of the first sampling unit 168-0 has a nominal capacitance $C_{NOM}$ in order to provide some minimum sampling capacitance for the largest expected $R_{DS}$. The sampling capacitor 178 of the second 168-1 sampling unit has a capacitance C, and each sampling capacitor 178 of the remaining sampling units 168-2, . . . , 168-M, has a capacitance twice that of the previous capacitor. In short, the sampling capacitors 178 of sampling units 168-1, 168-2, 168-3, . . . , 168-M have respective capacitances of C, 2C, $2^2$C, . . . , $2^{M-1}$C.

The sampling switches 170 and 172 of the first sampling unit 168-0 are controlled directly by the first timing signal. In the remaining sampling units 168-1, 168-2, . . . , 168-M, the first timing signal $\phi_1$ from timing line 138a is combined by an AND gate 179 with the respective output line $A_1$, $A_2$, $A_3$, . . . , $A_M$ from the A/D converter 160. The output of the AND gate 179 controls the first and second sampling switches 170 and 172. Thus, the variable capacitor 152 exhibits a total capacitance $C_{CS}$ which is inversely proportional to the digital signal output by the A/D converter 160, and consequently is inversely proportional to the resistance $R_{DS}$ of the power transistor 132'. Thus, the total charge Q stored in the variable capacitor 152 is proportional to the device current $I_D$ flowing through the load 134. The third and fourth sampling switches 174 and 176 in each sampling unit are controlled by the second timing signal $\phi_2$ from timing line 138b.

Figure 8:
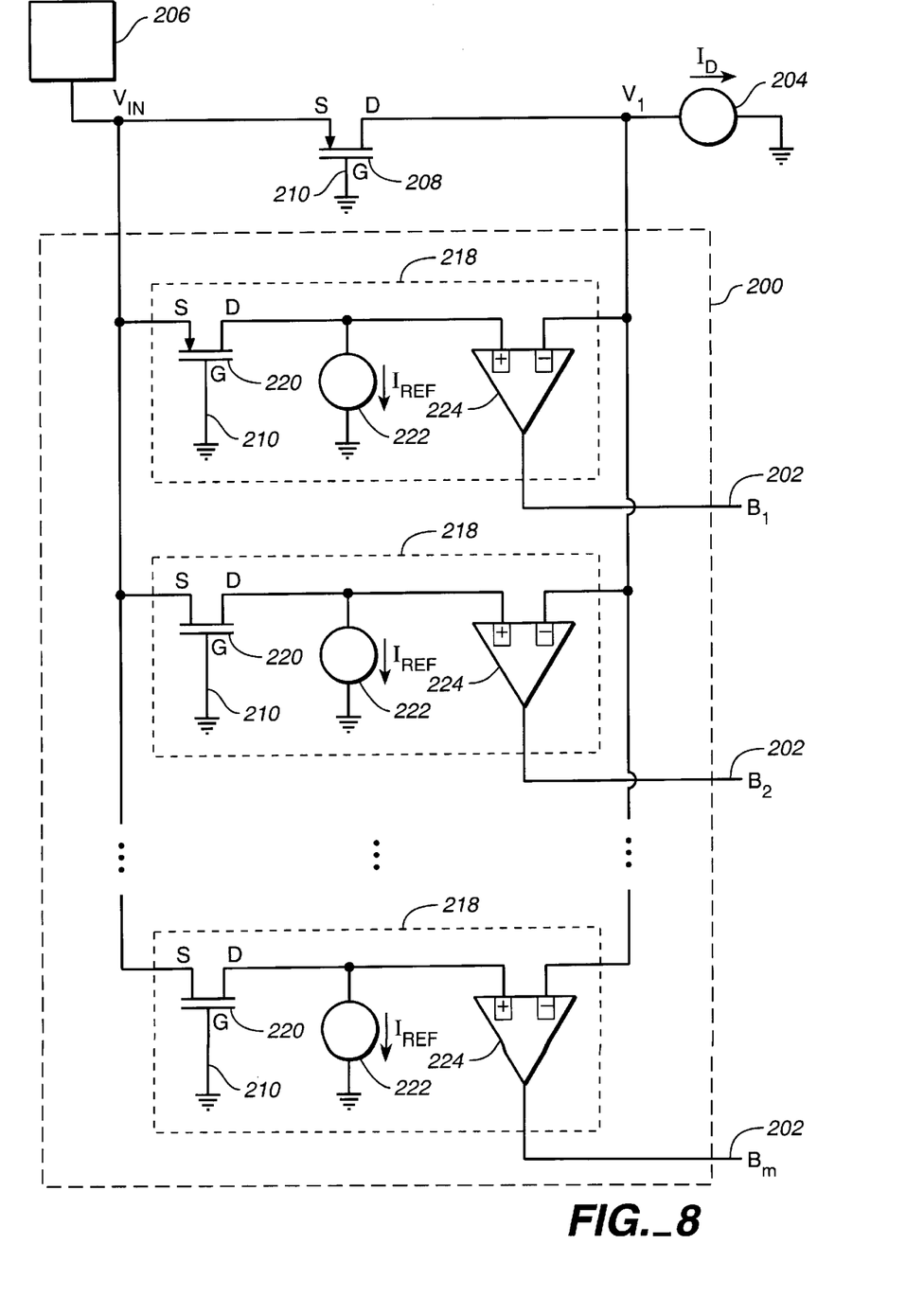
FIG. 8 is a schematic circuit diagram of a current sensor in which the current flowing out of the drain of a PMOS transistor is compared to a reference current.

Referring to FIG. 8, in another embodiment, a current sensor 200 generates a digital output signal on reference lines 202. The output signal has a known proportion to the device current $I_D$ flowing through a load 204. The load 204 is connected to an input voltage source 206 by a switch or power transistor 208, such as a PMOS transistor having a source connected the input voltage source 206, a drain connected to the load 204 and a gate connected to a control line 210. The current sensor 200 includes one or more comparator units 218, each of which compares the device current $I_D$ to a different known reference current and generates a digital output $B_1$, $B_2$, . . . , $B_M$, on the reference lines 202.

Each comparator unit 218 includes a reference transistor 220, a current source 222, and a comparator 224. The reference transistor 220 has a source connected to the input voltage source 206, a drain connected to the current source 222, and a gate connected to the control line 210. The reference transistor 220 is matched to the power transistor 208, i.e., the transistor elements are fabricated using the same process on the same chip and with the same dimensions so that they have substantially identical electrical characteristics. The current source 222, which may be a simple current mirror; a cascode current source, or a Wilson current source, permits a known current $I_{REF}$ through it. A positive input of the comparator 224 is connected to a first node 226 between the drain of the reference transistor 220 and the current source 222, and a negative input of the comparator 224 is connected to a second node 228 located between the drain of the power transistor 208 and the load 204. The output of the comparator is connected to the reference line 202.

In operation, assuming that the control line 210 is connected to ground so that transistors 208 and 220 are closed, the device current $I_D$ will flow from the input voltage source 206 through the power transistor 208 and into the load 204, and a reference current $I_{REF}$ will flow through the reference transistor 220 and the current source 222. The voltage $V_1$ at the first node 226 is given by $V_1=V_{IN}-(R_R \times I_{REF})$, whereas the voltage $V_2$ at the second node 228 is given by $V_2=V_{IN}-(R_P \times I_D)$. Since the reference transistor 220 is fabricated with a single transistor element, whereas the power transistor is fabricated with N transistor elements, the resistance $R_P$ of the power transistor 208 will be 1/N times the resistance $R_R$ of the reference transistor 220. Consequently, $V_1=V_N-(R_P \times N \times I_{REF})$. Thus, a particular comparator 224 will output a signal if the device current $I_D$ is greater than a threshold current $N \times I_{REF}$.

The threshold current may be set for each comparator unit 218 by varying the number of transistor elements in reference transistor 220 and/or the reference current generated by current source 222 in the comparator unit 218. By selecting appropriate threshold currents, the digital output $B_1, B_2, \ldots, B_M$, on the reference lines 202 will provide a digital signal that has a known proportion to the device current $I_D$.

What is claimed is:

1. A sensor for measuring a current passing through a load, comprising:
   a) a power transistor having a first terminal and a second terminal and including N substantially identical transistor elements, the first terminal of the power transistor connected to a substantially constant voltage, the second terminal of the power transistor connected to the load;
   b) a reference transistor having a first terminal and a second terminal and including M substantially identical transistor elements fabricated with substantially the same process and dimensions as the transistor elements of the power transistor, the first terminal of the reference transistor connected to one of
      i) the second terminal of the power transistor or
      ii) the substantially constant voltage,
   the second terminal of the reference transistor connected to a reference line; and
   c) an amplifier having a first input, a second input, and an output, the first input of the amplifier connected to the second terminal of the reference transistor, the second input of the amplifier connected to
      i) the substantially constant voltage if the first terminal of the reference transistor is connected to the second terminal of the power transistor, or
      ii) the second terminal of the power transistor if the first terminal of the reference transistor is connected to the substantially constant voltage,
   the output of thee amplifier connected to the reference line so as to force a first voltage across the power transistor to be equal to a second voltage across the reference transistor in the steady state, so as to generate a signal on the reference line having a current of known proportion to the current passing through the load.

2. The sensor of claim 1, wherein the substantially constant voltage is ground.

3. The sensor of claim 1, wherein the substantially constant voltage is a positive voltage supply.

4. The sensor of claim 1, wherein the current passing through the power transistor flows from the substantially constant voltage to the load.

5. The sensor of claim 4, wherein the power transistor and the reference transistor are PMOS devices, and the first terminal of the reference transistor is connected to the substantially constant voltage.

6. The sensor of claim 4, wherein the power transistor and the reference transistor are NMOS devices, and the first terminal of the reference transistor is connected to the second terminal of the power transistor.

7. The sensor of claim 1, wherein the current passing through the power transistor flows from the load to the substantially constant voltage.

8. The sensor of claim 7, wherein the power transistor and the reference transistor are PMOS devices, and the first terminal of the reference transistor is connected to the second terminal of the power transistor.

9. The sensor of claim 7, wherein the power transistor and the reference transistor are NMOS devices, and the first terminal of the reference transistor is connected to the substantially constant voltage.

10. The sensor of claim 1, further comprising a follower transistor having a gate connected to the output of the amplifier, a first terminal connected to the reference line, and a second terminal connected to the second terminal of the reference transistor.

11. A sensor for measuring a current passing through a load, comprising:
    a power transistor having a first terminal connected to substantially constant voltage and a second terminal connected to the load;
    a variable capacitor;
    a plurality of sampling switches connecting the variable capacitor in parallel with the power transistor;
    a controller configured to cause the variable capacitor to have a capacitance inversely proportional to a resistance of the power transistor, whereby a charge stored on the variable capacitor is proportional to the current passing through the power transistor when the sampling switches are opened.

12. The sensor of claim 11, wherein the controller generates a voltage signal that is proportional to the current passing through the power transistor.

13. The sensor of claim 12, wherein the power transistor includes N substantially identical transistor elements.

14. The sensor of claim 13, wherein the controller has a reference transistor with a first terminal and a second terminal, the reference transistor including M substantially identical transistor elements fabricated with substantially the same process and dimensions as the transistor elements of the power transistor, and wherein the first terminal of the reference transistor is connected to ground and the second terminal of the reference transistor is connected to a current source generating a known current, whereby the voltage at the first terminal of the reference transistor is proportional to the current passing through the power transistor.

15. The sensor of claim 14, further comprising a voltage source generating a known voltage and an analog-to-digital converter connected to the first terminal of the reference transistor and the voltage source to output a digital signal proportional to the ratio between the known voltage at the voltage at the first terminal of the reference transistor.

16. The sensor of claim 15, wherein the variable capacitor includes a plurality of individual capacitors, and the controller uses the digital signal to control the sampling switches so that the total capacitance of the variable capacitor is inversely proportional to the voltage at the first terminal of the reference transistor.

17. The sensor of claim 12, wherein the variable capacitor includes a binary weighted capacitor array, and the controller includes digital logic to control the sampling switches so that the capacitance of the variable capacitor is inversely proportional to the voltage signal.

18. The sensor of claim 17, wherein the voltage signal includes a digital signal on a plurality of lines, the variable capacitor includes an individual capacitor for each line, and the digital logic includes an AND gate for each line, and each AND gate has a first input connected to one of the lines, a second input connected to a timing signal, and an output connected to one of the sampling switches.

19. The sensor of claim 11, wherein the variable capacitor includes a plurality of individual capacitors, each individual capacitor having a first plate connected to the first terminal of the power transistor by a first sampling switch and a second plate connected to the second terminal of the power transistor by a second sampling switch.

20. A sensor for measuring a current passing through a load, comprising:
   a power transistor having a first terminal and a second terminal connected to the load;
   a variable capacitor including a plurality of individual capacitors, each individual capacitor including a first plate and a second plate;
   a plurality of first sampling switches, each first sampling switch connecting the first plate of a respective individual capacitor to the first terminal of the power transistor;
   a plurality of second sampling switches, each second sampling switch connecting the second plate of a respective individual capacitor to the second terminal of the power transistor;
   a sensor to generate a voltage proportional to the current passing through the power transistor; and
   a controller configured to control the pluralities of first and second sampling switches to cause the variable capacitor to have a capacitance inversely proportional to the voltage, whereby a charge stored on the variable capacitor is proportional to the current passing through the power transistor when the sampling switches are opened.

21. A sensor for measuring a current passing through a load, comprising:
   a power transistor having a first terminal and a second terminal, the power transistor completing a circuit between the load and a substantially constant voltage, the power transistor including N substantially identical transistor elements;
   a first reference transistor having a first terminal and a second terminal, the first reference transistor including M substantially identical transistor elements, the transistor elements of the first reference transistor fabricated with substantially the same process and dimensions as the transistor elements of the power transistor, the first terminal of the first reference transistor connected to the first terminal of the power transistor;
   a first comparator having a first input connected to the second terminal of the power transistor, a second input connected to the second terminal of the first reference transistor, and an output connected to a first reference line;
   a first current source generating a first known current connected to the second terminal of the first reference transistor, whereby a digital signal is output on the reference line indicative of whether the current passing through the load is greater than N/M times the first known reference current;
   a second reference transistor having a first terminal and a second terminal, the second reference transistor including L substantially identical transistor elements, the transistor elements of the second reference transistor fabricated with substantially the same process and dimensions as the transistor elements of the power transistor, the first terminal of the second reference transistor connected to the first terminal of the power transistor;
   a second comparator having a first input connected to the second terminal of the power transistor, a second input connected to the second terminal of the second reference transistor, and an output connected to a second reference line; and
   a second current source generating a second known current connected to a node between the second terminal of the second reference transistor and the second input of the second comparator, whereby a second digital signal is output on the reference line if the current passing through the load is greater than N/L times the second known reference current.

22. The sensor of claim 21, wherein the power transistor and first reference transistor are PMOS devices.

23. The sensor of claim 21, wherein M is 1.

24. The sensor of claim 21, wherein L and M are different.

25. The sensor of claim 21, wherein the first known reference current and the second known reference current are different.

* * * * *